(12) United States Patent
Lwee

(10) Patent No.: US 6,659,802 B1
(45) Date of Patent: Dec. 9, 2003

(54) CARD CONNECTOR HAVING CONTROL IC THEREIN

(75) Inventor: Nai-Hock Lwee, Singapore (SG)

(73) Assignee: Tai-Sol Electronics Co., Ltd., Taipei Hsien (TW)

( * ) Notice: Subject to any disclaimer, the term of this patent is extended or adjusted under 35 U.S.C. 154(b) by 0 days.

(21) Appl. No.: 10/331,760

(22) Filed: Dec. 31, 2002

(30) Foreign Application Priority Data

Oct. 23, 2002 (TW) ...................................... 91216935 U

(51) Int. Cl.[7] .............................................. H01R 24/00
(52) U.S. Cl. ...................... 439/630; 439/67; 439/76.1
(58) Field of Search ............................... 439/630, 76.1, 439/67

(56) References Cited

U.S. PATENT DOCUMENTS 6,250,965 B1 * 6/2001 Neifer ........................ 439/630
6,371,770 B1 * 4/2002 Lai ............................. 439/67
6,386,920 B1 * 5/2002 Sun ............................ 439/630
6,520,789 B2 * 2/2003 Daugherty, Jr. et al. ...... 439/67

* cited by examiner

Primary Examiner—Tho D. Ta
(74) Attorney, Agent, or Firm—Bacon & Thomas, PLLC

(57) ABSTRACT

A card connector having a control integrated circuit IC therein is composed of a housing having an open base frame, two printed circuit boards (PCB) bonded to top and bottom sides of the open base frame and two receiving open chambers defined between the open base frame and the two PCBs for accommodating two different cards. The PCBs respectively has a circuit pattern, contact pads for connecting external devices, contact pins respectively received in the receiving open chambers for connecting an inserted card to be loaded in the receiving open chambers, a flex membrane circuit board electrically connected between the two PCBs, and a control IC installed in one of the PCBs and electrically connected to the circuits of the same PCB.

4 Claims, 5 Drawing Sheets

CARD CONNECTOR HAVING CONTROL IC THEREIN

BACKGROUND OF THE INVENTION

1. Field of the Invention

The present invention relates to card connectors, and more particularly to a card connector having a control integrated circuit (IC) therein, which requires less installation space.

2. Description of the Related Art

U.S. Pat. No. 6,402,529 discloses a card connector, which has two accommodation portions for receiving different kinds of cards, i.e. multimedia card (MMC), secure digital (SD), and smart media (SM). The card connector includes two accommodation portions for receiving different kinds of cards with different external shapes and different contact pads to be inserted into the card connector from one and the same card insertion slot. A plurality of copper strips are provided inside the housing of the card connector for contacting contact pads of an inserted memory card, and are extended to a rear side of the card connector for connecting external circuit means.

U.S. Pat. No. 6,091,605 discloses a PC card connector and its structure.

While using the aforesaid memory card connector via the aforesaid PC card connector, the memory card connector is installed inside the PC card connector, and then a control IC loaded printed circuit board (PCB) is connected to the memory card and positioned inside the PC card connector. The internal space of the PC card connector must be sufficient to accommodate the memory card connector and the control IC loaded PCB.

SUMMARY OF THE INVENTION

The present invention has been accomplished under the circumstances in view. It is therefore the main object of the present invention to provide a card connector, which requires less installation space.

To achieve the foregoing object of the present invention, the card connector is composed of a housing, a plurality of contact pins, a plurality of lead wires, and a control IC. The housing includes an open base frame, which is bonded with two PCBs at top and bottom sides thereof and is provided with two receiving open chambers defined between the open base frame and the two PCBs for accommodating different cards. Each of the PCBs has a circuit pattern and a plurality of slots. Each of the contact pins has an end connected to circuits of the PCBs and is partially received in the slots of the PCBs and are electrically connected to the circuits of the PCBs. The control IC is installed in one of PCBs and is electrically connected to the circuits of the same printed circuit board.

DETAILED DESCRIPTION OF THE INVENTION

Figure 1:
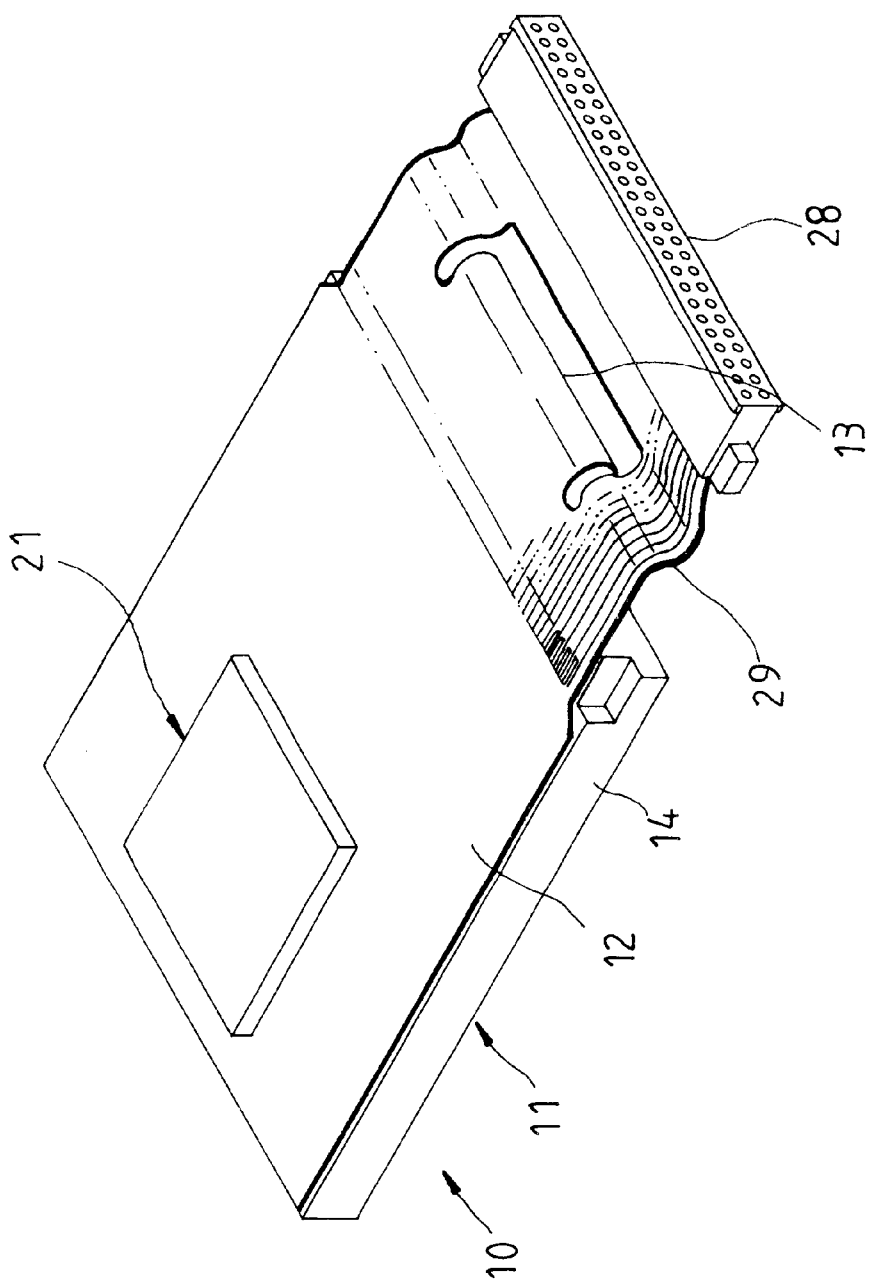
FIG. 1 is a perspective view of a first preferred embodiment of the present invention.
Figure 2:
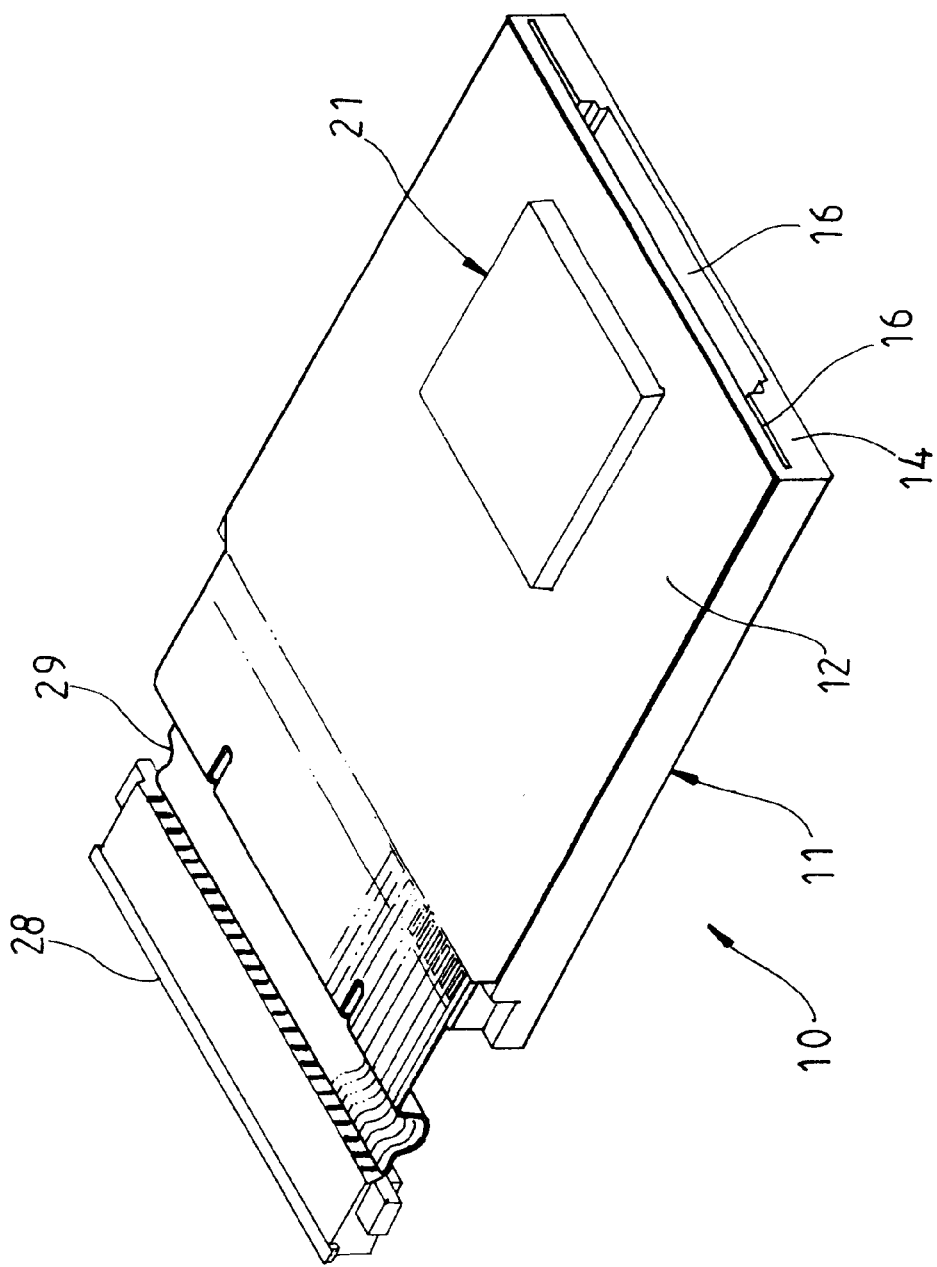
FIG. 2 is a perspective view of the first preferred embodiment of the present invention at another angle.
Figure 3:
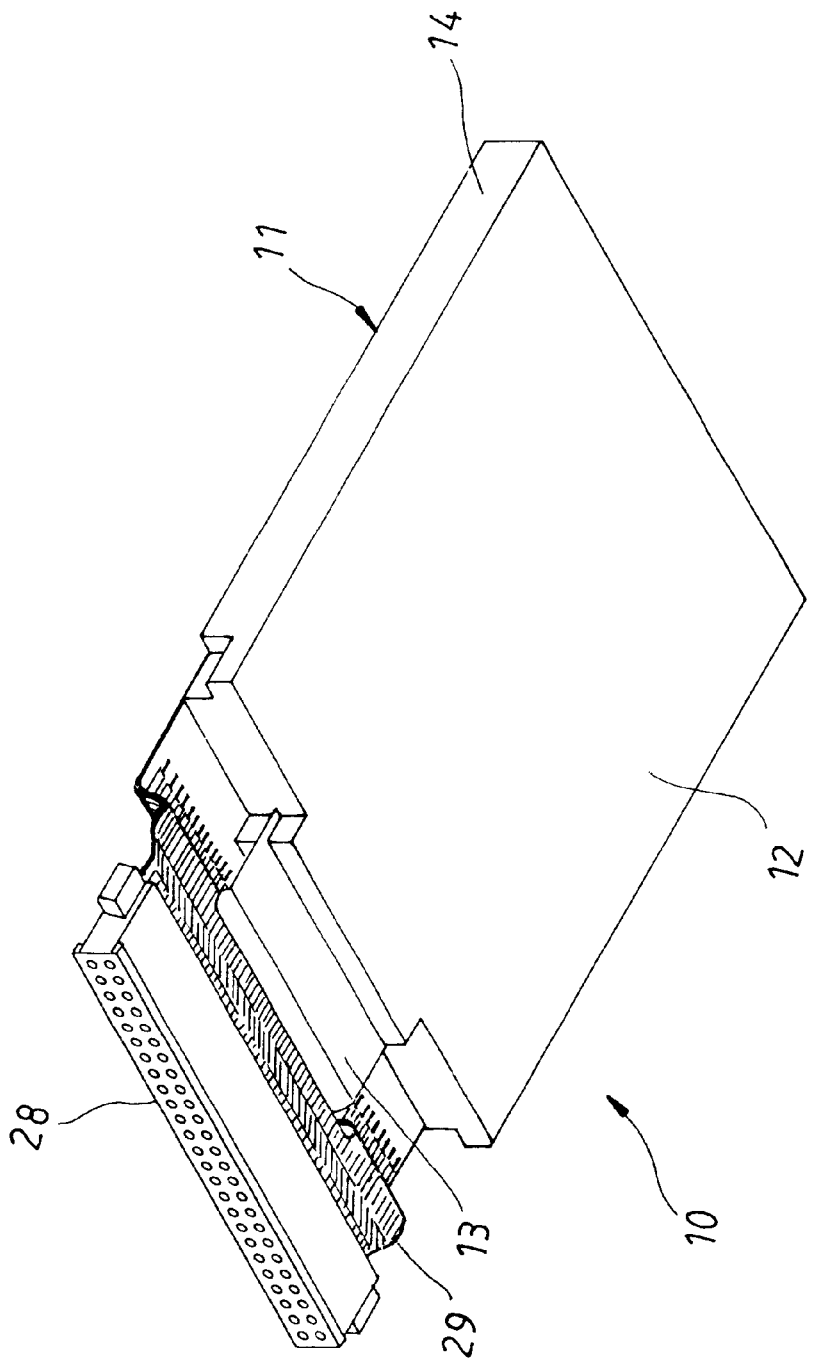
FIG. 3 is a perspective view of the first preferred embodiment of the present invention at another angle.

Referring to FIGS. 1–3, a card connector 10 in accordance with a first embodiment of the present invention is composed of a housing 11, a control IC 21, and a multi-pin position socket 28.

The housing 11 includes of an open base frame 14, two PCBs 12 bonded to the top and bottom sides of the open base frame 14, and a flex membrane circuit board 13. Two receiving open chambers 16 are defined between the PCBs 12 and the open base frame 14 for accommodating two different cards (not shown). The PCBs 12 respectively have a circuit pattern (not shown), a plurality of contact pads (not shown) for connecting to external devices. The circuits of the two PCBs 12 are electrically connected by the flex membrane circuit board 13. The control IC 21 is installed in one of the PCBs 12 by means of surface mounting technique (SMT) and is electrically connected to the circuits of the same PCB 12. The multi-pin position socket 28 is electrically connected to the contact pads of the PCB 12 above the other via the flex membrane circuit board 13.

While in use, the multi-pin position socket 28 is connected to a readable apparatus, such as a digital still camera, a TV game machine, or the like, adapted to access the cards being loaded in one receiving open chamber 16. Because the control IC 21 is directly installed in one of the PCBs 12, it is unnecessary to use an additional PCB to connect the control IC to a card connector as what the prior design did. Additionally, the PCBs 12 are disposed with circuits at top and bottom sides thereof such that the control IC 21 can directly be installed on the PCBs 12 to be electrically connected to the circuits of the PCBs 12. Therefore, the present invention greatly reduces the space occupied by the card connector.

Figure 4:
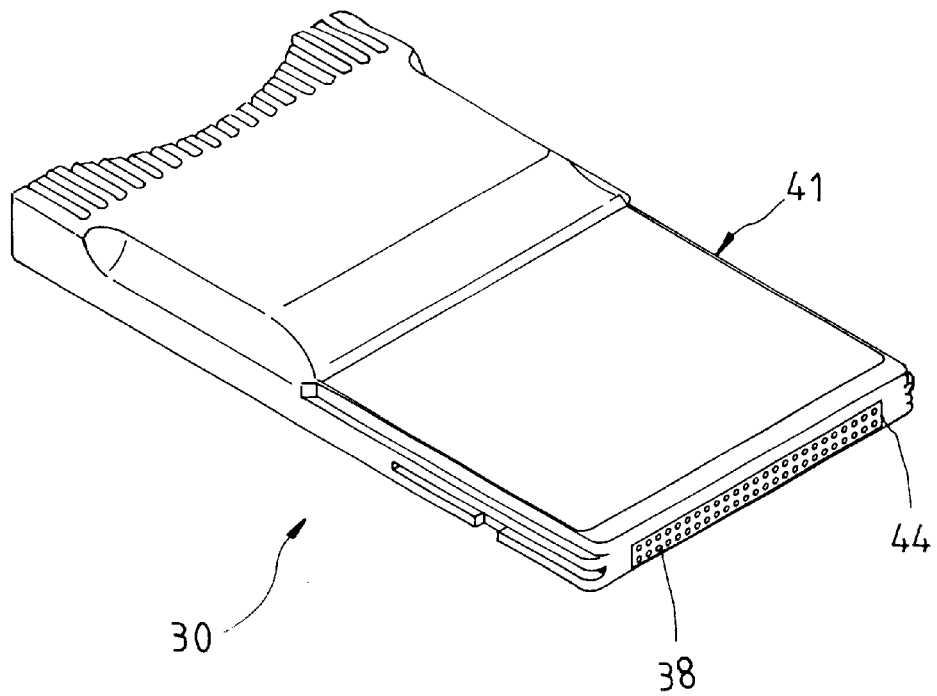
FIG. 4 is a perspective view of a second preferred embodiment of the present invention.
Figure 5:
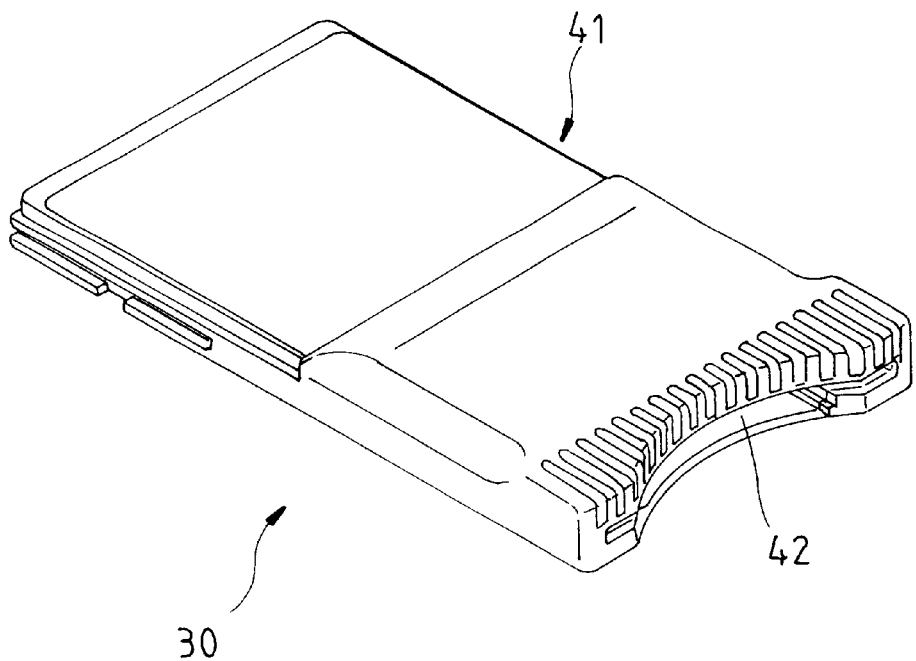
FIG. 5 is a perspective view of the second preferred embodiment of the present invention.
Figure 6:
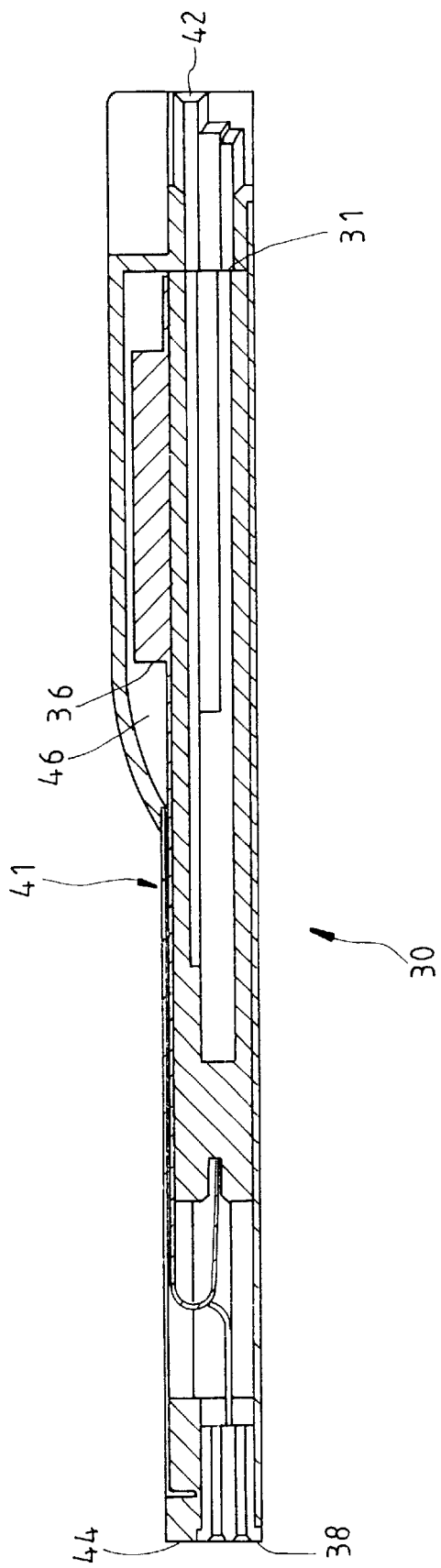
FIG. 6 a sectional view of the second preferred embodiment of the present invention.

Referring to FIGS. 4–6, a second preferred embodiment of the present invention is substantially similar to the aforesaid first embodiment with the minor exceptions described below. The card connector 30 further includes a case 41, which is a flat container having a flat front opening 42 at an end thereof and a rectangular opening 44 at the other end thereof. The case 41 has a body portion protruding outwardly so as to form an additional accommodation portion 46. The housing 31 is mounted inside the case 41. The control IC 36 is received in the accommodation portion 46. The multi-pin position socket 28 is positioned in the rectangular opening 44. The receiving open chambers 16' are located in the flat opening 42. The case 41 is externally positioned around the card connector to protect the card connector from damage during a delivery or the like and is more compact than the prior art.

As indicated above, the present invention provides the card connector having a control IC therein, which requires less installation space.

What is claimed is:

1. A card connector comprising:

a housing including an open base frame, two printed circuit boards (PCB) bonded to top and bottom sides of said open base frame and two receiving open chambers defined between said open base frame and said two PCBs for accommodating two different cards, said PCBs respectively having a circuit pattern, contact pads for connecting external devices, and contact pins respectively extending into said receiving open chambers for connecting an inserted card, and a flex membrane circuit board electrically connected between said two PCBs; and a control integrated circuit (IC) installed on one of said PCBs and electrically connected to the circuits of the same PCB.

2. The card connector as defined in claim 1 further comprising a multi-pin position socket electrically connected to said contact pads of at least one of said PCBs via said flex membrane circuit board.

3. The card connector as defined in claim 1, wherein said control IC is installed on one of said PCBs by surface mounting technique (SMT).

4. A card connector comprising:

a case including a flat front opening at an end thereof, a rectangular opening at another end thereof, and a body portion protruding outwardly and forming an accommodation portion;

a housing including an open base frame, two PCBs bonded to top and bottom sides of said open base frame and two receiving open chambers defined between said open base frame and said two PCBs and respectively facing said flat opening of said case for accommodating two different cards, said PCBs respectively having a circuit pattern, contact pads for connecting external devices, and contact pins respectively received in said receiving open chambers for connecting an inserted card to be loaded in said receiving open chambers, and a flex membrane circuit board electrically connected between said PCBs;

a control IC installed on one of said PCBs and electrically connected to the circuits of the same PCB and received in said accommodation portion of said case; and a multi-pin position socket electrically connected to said contact pads of at least one of said PCBs via said flex membrane circuit board;

said housing being received in said case, said control IC being positioned in said accommodation portion, said multi-pin position socket being positioned said rectangular opening, said receiving open chamber facing said flat opening of said case.

* * * * *